United States Patent
Lee et al.

(10) Patent No.: US 6,331,478 B1
(45) Date of Patent: Dec. 18, 2001

(54) METHODS FOR MANUFACTURING SEMICONDUCTOR DEVICES HAVING CHAMFERED METAL SILICIDE LAYERS

(75) Inventors: Keum-joo Lee, Incheon; In-seak Hwang; Yong-sun Ko, both of Suwon; Chang-Iyoung Song, Kyungki-do, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/685,456

(22) Filed: Oct. 9, 2000

(30) Foreign Application Priority Data

Oct. 7, 1999 (KR) .................................................. 99-43209

(51) Int. Cl.$^7$ ................................................ H01L 21/4763
(52) U.S. Cl. ........................ 438/592; 438/683; 438/750; 438/755
(58) Field of Search ...................... 438/586, 592, 438/595, 299, 673, 682, 683, 749, 750, 755

(56) References Cited

U.S. PATENT DOCUMENTS

| | | | |
|---|---|---|---|
| 4,285,761 | 8/1981 | Fatula, Jr. et al. | 156/628 |
| 4,319,395 | 3/1982 | Lund et al. | 29/571 |
| 4,914,056 | * 4/1990 | Okumura . | |
| 5,262,352 | 11/1993 | Woo et al. | 437/189 |
| 5,491,100 | 2/1996 | Lee et al. | 437/41 |
| 5,491,110 | 2/1996 | Fehr et al. | 437/206 |
| 5,502,336 | 3/1996 | Park et al. | 257/754 |
| 5,541,131 | 7/1996 | Yoo et al. | 437/44 |
| 5,591,670 | 1/1997 | Park et al. | 437/187 |
| 5,698,072 | * 12/1997 | Fukuda . | |
| 5,751,048 | 5/1998 | Lee et al. | 257/412 |
| 5,811,335 | 9/1998 | Santangelo et al. | 438/268 |
| 5,814,537 | * 9/1998 | Maa et al. . | |
| 5,856,239 | 1/1999 | Bashir et al. | 438/738 |
| 5,933,757 | * 8/1999 | Yoshikawa et al. . | |
| 5,994,192 | * 11/1999 | Chen . | |
| 6,001,719 | 12/1999 | Cho et al. | 438/592 |
| 6,235,621 | * 5/2001 | Jeng et al. . | |

OTHER PUBLICATIONS

Stanley Wolf and Richard N. Tauber, "Silicon Processing for the VLSI Era, vol. 1: Process Technology," Lattice Press, Sunset Beach, California (1986), pp. 384–388.*

Mayer et al., *Electronic Materials Science for Integrated Circuits in Si and GaAs*, Macmillan Publishing Company, New York, New York, 294–295 (1990).

* cited by examiner

*Primary Examiner*—Charles Bowers
*Assistant Examiner*—Stephen W. Smoot
(74) *Attorney, Agent, or Firm*—Myers Bigel Sibley & Sajovec, P.A.

(57) ABSTRACT

Methods for manufacturing a semiconductor device, in which a chamfered metal silicide layer is formed by a 2-stage continuous wet etching process using different etchants, thereby resulting in a sufficient insulation margin between a lower conductive layer including the metal silicide layer and the contact plug self-aligned with the lower conductive layer are disclosed. In the manufacture of a semiconductor device, a mask pattern is formed on a metal silicide layer to expose a portion of the metal silicide layer. The exposed portion of the metal silicide layer is isotropically etched in a first etchant to form a metal silicide layer with a shallow groove, and defects due to the silicon remaining on the surface of the metal silicide layer with the shallow groove are removed using a second etchant, to form a metal silicide layer with a smooth surface. Microelectronic structures produced by methods of the present invention are also disclosed.

17 Claims, 6 Drawing Sheets

METHODS FOR MANUFACTURING SEMICONDUCTOR DEVICES HAVING CHAMFERED METAL SILICIDE LAYERS

RELATED APPLICATION

This application is related to Korean Application No. 99-43209, filed Oct. 7, 1999.

FIELD OF THE INVENTION

The present invention relates to methods for manufacturing semiconductor devices, and more particularly, to methods for manufacturing semiconductor devices having self-aligned contact plugs.

BACKGROUND OF THE INVENTION

As the integration density of semiconductor devices continues to increase, the distance from contact holes that connect lower and upper interconnection layers to surrounding interconnections typically decreases and the aspect ratio of the contact holes typically increases. Thus, highly integrated semiconductor devices adopting a multilayered interconnection structure may require more accurate and strict processing conditions when contact holes are formed by using photolithography techniques. In manufacturing semiconductor devices having a design rule of 0.25 μm or less, current lithography techniques may not be sufficient to reproducibly perform desirable processes with the same accuracy.

In order to overcome limitations of photolithography in the formation of contact holes, self-alignment techniques have been suggested for forming contact holes. For example, self-alignment techniques employing nitride spacers as an etch stop layer in the formation of self-aligned contact holes have been suggested.

A conventional self-alignment technique is illustrated in FIG. 2. In FIG. 2A, a lower structure, for example, a conductive layer 122 such as a gate electrode having a substantially rectangular section, is initially formed on a semiconductor substrate 120 via patterning provided by a general photolithography process. In FIG. 2B, a layer of nitride 124 is deposited on the entire surface of the conductive layer 122. In FIG. 2C, the resultant structure is subjected to an etchback process so as to form nitride spacers 124a on the sidewalls of the conductive layer 122. In FIG. 2D, an interlayer dielectric (ILD) film 126 is formed of an oxide layer on the structure. In FIG. 2E, a photoresist pattern 128 is formed on the ILD film 126 for exposing contact holes. In FIGS. 2F and 2G, the ILD film 126 is etched to form self-aligned contact hole 130.

In the conventional self-aligned contact hole formation, the ILD film 126 is etched with a high degree of selectivity relative to the nitride spacers 124a, to form the contact hole 130. During the etching process, carbon rich carbon fluoride gases, for example, $C_4F_8$ or $C_5F_8$, may be used so as to increase the selectivity.

These gases may typically produce a large amount of polymers. Thus, if the etching conditions are set such that selectivity is increased, the amount of polymers produced by the etching increases. As a result, the etching may be stopped after formation of the ILD layer 126a but before formation of contact hole 130, as illustrated, for example, in FIG. 2F.

Alternatively, as illustrated in FIG. 2G, when the selectivity between the ILD film 126 and the nitride spacers 124a is decreased, ILD layers 126a and a complete contact hole 130 can be formed without the interruption due to the polymer. However, when the selectivity is low, the nitride spacers 124a may be etched together with the ILD film 126 during the etching process. Accordingly, the width Wn of the remaining nitride spacers 124a may be too small to provide a desired degree of insulation layer between the sidewalls of the conductive layers 122 and the contact hole 130. Thus, a short between a self-aligned contact plug in the contact hole 130 and the conductive layers 122 may occur, for example, at exposed sidewall 122s.

In the self-aligned contact hole formation for manufacturing large scale integration semiconductor devices, the process margin may be small even under optimal processing conditions, and thus it may be difficult to reproducibly produce devices with the same accuracy.

SUMMARY OF THE INVENTION

According to embodiments of the present invention, methods for manufacturing semiconductor devices with an increased process margin may ensure that a desired insulation length between an electrically conductive line and a self-aligned contact plug is maintained during self-aligned contact hole formation when manufacturing highly integrated semiconductor devices.

According to aspects of the present invention, a method for manufacturing a semiconductor device includes forming a mask pattern on a metal silicide layer to expose a portion of the metal silicide layer. The exposed portion of the metal silicide layer is isotropically etched in a first etchant to form a metal silicide layer with a shallow groove having silicon defects on the surface thereof. Then, the metal silicide layer with the shallow groove is isotropically etched in a second etchant to remove the silicon defects and to form a metal silicide layer with a smooth surface. Preferably, the first etchant is a mixture of $NH_4OH$, $H_2O_2$ and $H_2O$, and the second etchant is a mixture of $HNO_3$, $CH_3COOH$, HF and $H_2O$.

In other embodiments of the present invention, a method for manufacturing a semiconductor device includes forming a metal silicide layer on a semiconductor substrate. A mask pattern is formed on the metal silicide layer to expose a portion of the metal silicide layer, and the exposed portion of the metal silicide layer is isotropically etched in a first etchant using the mask pattern as an etching mask to form a metal silicide layer with a shallow groove. The metal silicide layer with the shallow groove is isotropically etched in a second etchant using the mask pattern as an etching mask to form a metal silicide layer with a recessed region having a smooth surface, which defines a undercut region beneath the bottom edge of the mask pattern. The exposed metal silicide layer is anisotropically etched using the mask pattern as an etching mask, to form a metal silicide pattern having lower edges substantially perpendicular to the major surface of the semiconductor substrate, and upper edges which are chamfered along the contour of the undercut region. Preferably, the second etchant etches silicon better than the first etchant. Preferably, the width of the top surface of the metal silicide pattern is defined by chamfers at both sides thereof, and is greater than half the width of the mask pattern.

In still other embodiments of the present invention, the semiconductor device manufacturing method further includes forming insulation spacers on the sidewalls of the mask pattern and metal silicide pattern. Interlayer dielectric patterns with a self-aligned contact hole therebetween, which exposes both the insulation spacers and an active region of the semiconductor substrate are formed. The self-aligned contact hole is filled with a conductive material to form a contact plug self-aligned with the metal silicide pattern.

In yet other embodiments of the present invention, the semiconductor device manufacturing method further includes forming an insulating layer on the metal silicide layer. A photoresist pattern is formed on the insulating layer. The insulation layer is etched using the photoresist pattern as an etching mask to form the mask pattern, and then the photoresist pattern is removed by an ashing process. Then, the residue is stripped off in a wet cleaning system. Here, the etching in the first etchant and the etching in the second etchant are continuously carried out in the wet cleaning system immediately after stripping off the residue.

According to the present invention, by forming smooth chamfers without defects on upper sidewall edges of the upper conductive layer of an electrically conductive line, such as a gate structure, insulation spacers having a sufficient width between the conductive layer and the contact plugs self-aligned therewith are provided, resulting in microelectronic devices having improved electrical properties. In addition, the undercut regions can be formed by efficiently utilizing etching processes which are currently used in the manufacture of semiconductor devices thereby providing improved microelectronic devices with minimal disruption to current semiconductor device manufacturing processes. The inventive methods may be advantageous in manufacturing highly integrated semiconductor devices having a design rule of 0.25 µm or less.

DESCRIPTION OF PREFERRED EMBODIMENTS

Figure 1A:
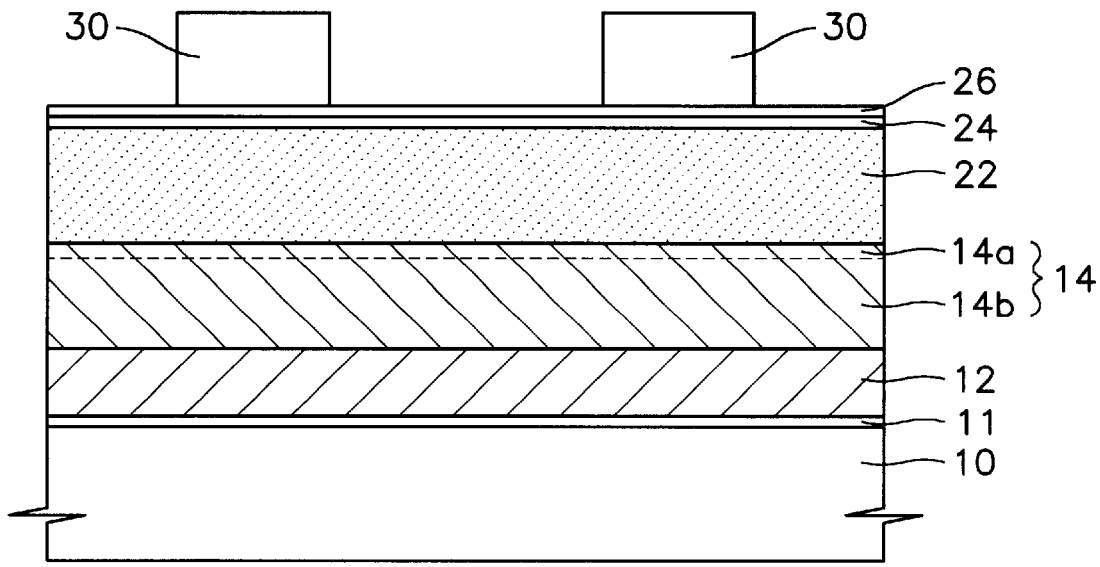
FIGS. 1A through 1H are sectional views illustrating the manufacture of a semiconductor memory device according to embodiments of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. In contrast, when an element is referred to as being "directly on" another element, there are no intervening elements present. In the drawings, like reference numerals are used to refer to like elements throughout. Unless otherwise noted, all percentages are by weight based on the total weight thereof and all ranges stated to be between a first endpoint and a second endpoint include the first and the second endpoints.

Referring to FIG. 1A, an oxide layer 11 is formed on a semiconductor substrate 10, and a doped polysilicon layer 12 and a metal silicide layer 14 are formed on the oxide layer 11. The metal silicide layer 14 may be formed of various materials including, for example, tungsten silicide ($WSi_x$), titanium silicide ($TiSi_x$), tantalum silicide ($TaSi_x$), cobalt silicide ($CoSi_x$), or mixtures thereof. Silicon migration may occur in the metal silicide layer 14 after the metal silicide layer 14 is formed, which may result in a Si-rich stratum 14a and a metal-rich stratum 14b in the metal silicide layer 14.

Still referring to FIG. 1A, a silicon nitride layer 22, a high-temperature oxide (HTO) layer 24, and an anti-reflective coating film 26 are sequentially formed on the metal silicide layer 14. In alternative embodiments, the formation of the HTO layer 24 and the anti-reflective coating film 26 may be omitted. A photoresist pattern 30 is formed on the anti-reflective coating film 26. The photoresist pattern 30 exposes the surface of the anti-reflective coating film 26 where contact holes are to be formed.

Figure 1B:
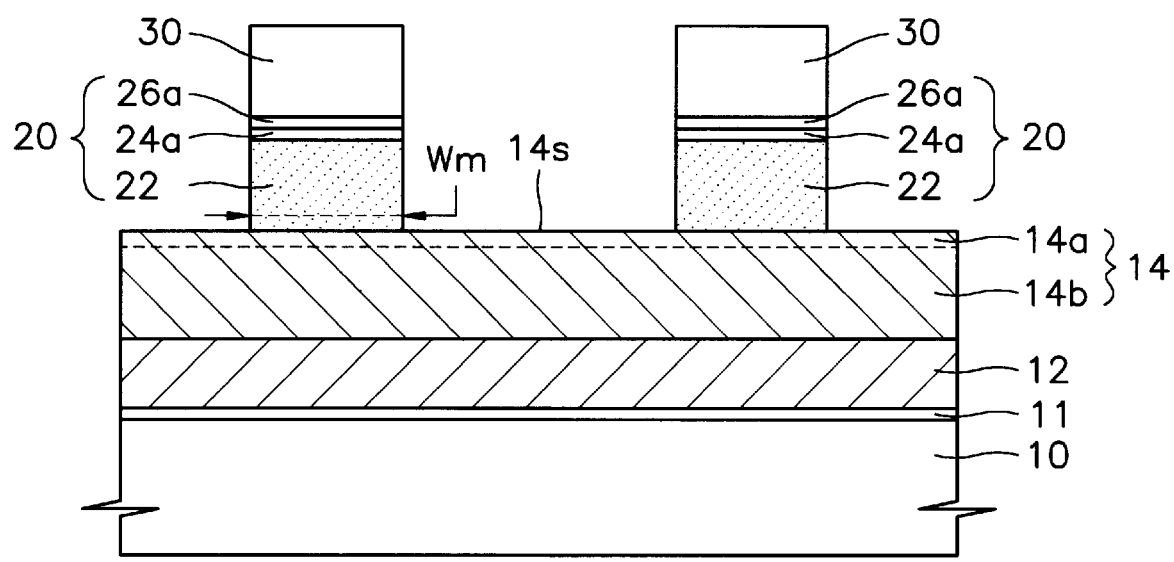

Referring to FIG. 1B, the anti-reflective coating film 26, the HTO layer 24, and the silicon nitride layer 22 are subjected to anisotropic dry etching by using the photoresist pattern 30 as an etching mask, resulting in a silicon nitride pattern 22a, a HTO pattern 24a, and an anti-reflective coating pattern 26a, which together form a mask pattern (an electrically insulating capping layer) 20 . Accordingly, the surface of the metal silicide layer 14 is partially exposed by the mask pattern 20 formed thereon having a predetermined width Wm.

Still referring to FIG. 1 B, the Si-rich stratum 14a extends within a predetermined depth from the top surface 14s of the metal silicide layer 14 which is exposed by the photoresist pattern 30. The metal-rich stratum 14b contains less silicon with respect to the Si-rich stratum 14a . The Si-rich stratum 14a refers to a region having a relatively high silicon-to-metal ratio. For example, if the metal silicide layer 14 is formed of a tungsten silicide layer, the Si-rich stratum 14a is in a phase of $WSi_{2.2}$ to $WSi_{2.5}$, which contains more silicon than in the phase of $WSi_2$, which may be more desirable. The metal silicide layer 14 may be crystalized by a subsequent annealing process, which is undesirable. Once crystalized, a metal-to-silicon ratio differs between the surface of crystal grains in the metal silicide layer 14 and the inside of the crystal grains, which may result in Si-rich regions in the metal silicide layer 14, containing a relatively higher concentration of silicon than in the $WSi_2$ phase.

Figure 1C:
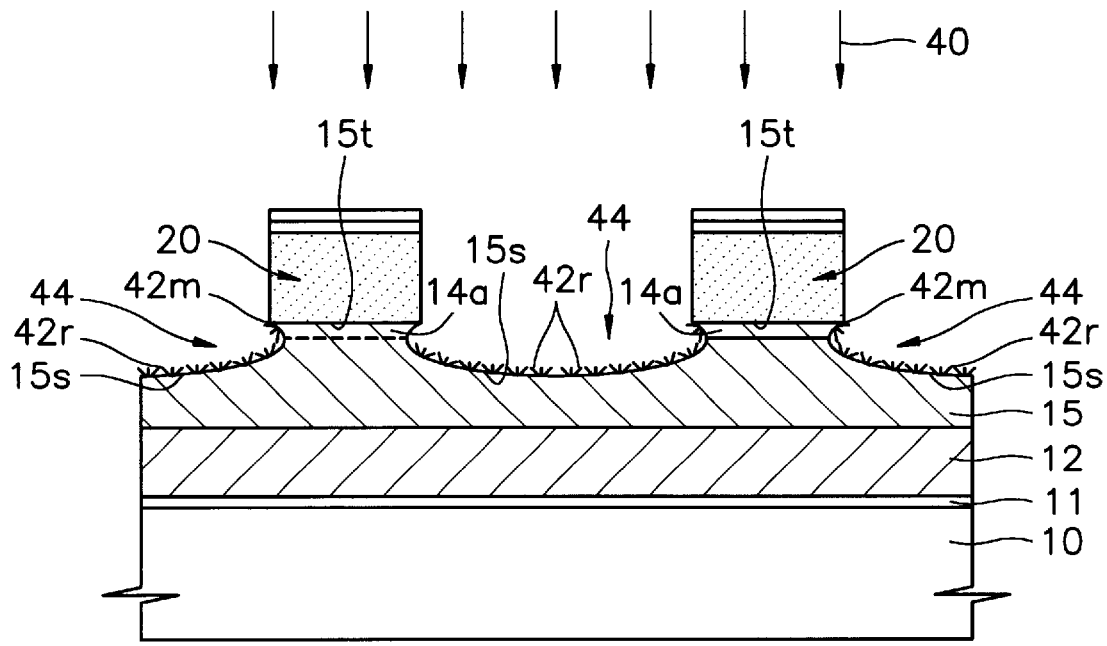

Turning to FIG. 1C, the photoresist pattern 30 is removed by ashing with $O_2$ plasma. In alternate embodiments, the ashing process may also utilize $N_2$, He or He-$O_2$ gas. After the ashing process, a stripping process is carried out in a stripping solution containing hydrosulfuric acid ($H_2SO_4$) so as to remove contaminants that may remain on the wafer after the ashing of the photoresist pattern 30. Thereafter, a rinsing process may be performed on the wafer using various techniques as will be understood by those skilled in the art.

Still referring to FIG. 1C, the metal silicide layer 14 is isotropically wet etched in a first etchant 40 using the mask pattern 20 as an etching mask to form a metal silicide layer 15 having shallow grooves 44. The first etchant 40 may be a mixture of $NH_4OH$, $H_2O_2$ and $H_2O$ and hereinafter will be referred to as a "SC1 solution". The SC1 solution used as the first etchant 40 preferably comprises between about 0.5 and 3% $NH_4OH$ and between about 2 and 20% $H_2O_2$. More preferably, the SC1 solution comprises between about 1.5 and 2% $NH_4OH$ and between about 3.8 and 4.5% $H_2O_2$. For the isotropic wet etching of the metal silicide layer 14, the temperature of the first etchant 40 is preferably maintained at a temperature between about 30 and 90° C., and, more preferably, at about 70° C. Following the first etching process, a rinsing process may be performed on the resultant structure using various techniques as will be understood by those skilled in the art.

The SC1 solution with the above composition provides a vertical-to-lateral etching ratio of approximately 2:1 with respect to the metal silicide layer 14, which exhibits a higher etching ratio with respect to metal than with respect to silicon. This characteristic of the SC1 solution results in rough surface 15s of the metal silicide layer 15 within the shallow groove 44. The rough surface 15s, which may have fluey defects 42r, may be caused by the silicon remaining in the Si-rich region due to the crystallization of the metal silicide layer 15. The Si-rich stratum 14a is comparatively less etched in the SC1 solution, and an edge 42m of the top surface 15t of the metal silicide layer 15, which is the Si-rich stratum 14a remaining beneath the mask pattern 20, has a sharp profile due to vigorous silicon migration compared to the other region. For this reason, the use of the first etchant 40 containing the SC1 solution in wet etching the metal silicide layer 14 cannot effectively expose the bottom edge of the mask pattern 20.

Figure 1D:
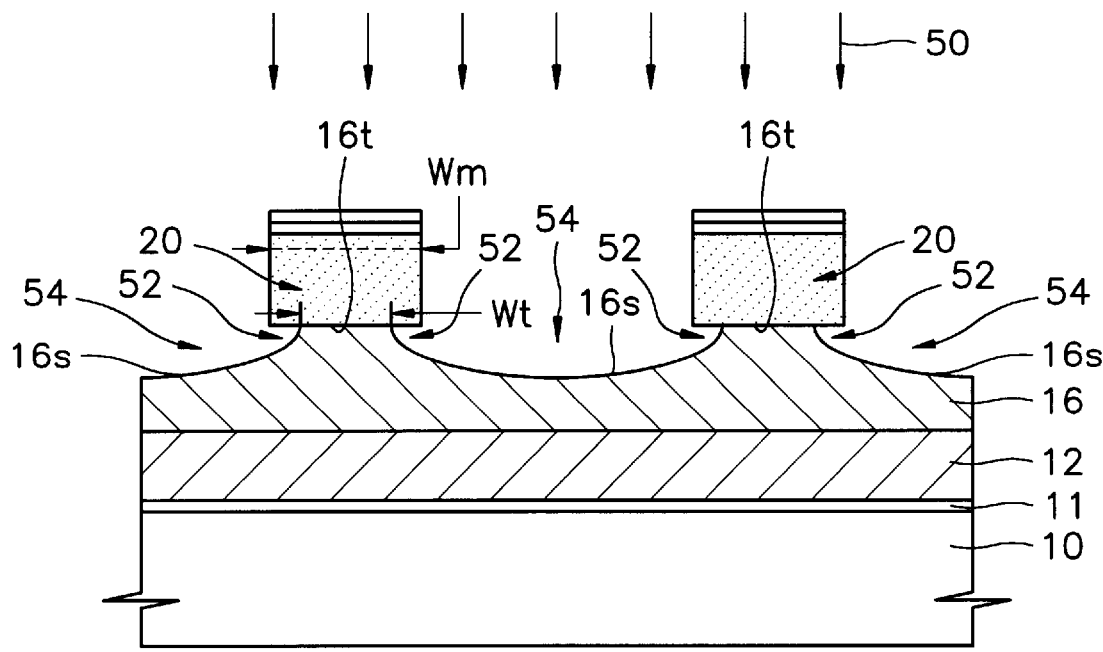

Referring now to FIG. 1D, after wet etching using the first etchant 40, a wet etching process using an etchant appropriate for etching silicon is further performed. The exposed surface of the metal silicide layer 15 within the shallow groove 44 is isotropically wet etched in a second etchant 50 using the mask pattern 20 as an etching mask. The second etchant 50 may be a mixture of $HNO_3$, $CH_3COOH$, HF and $H_2O$ and hereinafter will be referred to as dilution polyetchant (DSPE). The DSPE used as the second etchant 50 preferably comprises between about 3 and 38% $HNO_3$, between about 0.5 and 3.5% $CH_3COOH$ and between about 0.05 and 0.65% HF. More preferably, the DSPE comprises about 24.8% $HNO_3$, about 1.8% $CH_3COOH$ and about 0.43% HF. The DSPE exhibits a comparatively good etching property with respect to silicon, and a vertical-to-lateral etching ratio of about 1.2:1 to 1.4:1 with respect to the metal silicide layer. The wet etching using the DSPE is preferably performed at room temperature.

Still referring to FIG. 1D, the isotropic etching in the second etchant 50 removes the fluey defects 42r and the edge 42m, which results in a metal silicide layer 16 having a recessed region 54 and a smooth surface 16s. Also, an undercut region 52 is defined near the bottom edge of the mask pattern 20 by the recessed region 54. The DSPE used as the second etchant 50 exhibits a better etching property in the lateral direction than the SC1 solution, and thus the isotropic etching in the DSPE can form the undercut region 52 that effectively exposes the bottom edge of the mask pattern 20. Also, the smooth surface 16s of the recessed region 54, which defines the undercut region 52, offers a favorable contour of the undercut region 52 for increasing insulation margin by the undercut region 52.

As for the isotropic wet etching of the metal silicide layer 15 with the shallow groove 44 using the second etchant 50, a lateral-to-vertical etching ratio in the metal silicide layer 15 must be accurately controlled by varying the composition of the second etchant 50 and the etching time. Preferably, etching conditions for the etching process using the second etchant 50 are controlled such that the width Wt of the top surface 16t of the resulting metal silicide layer 16 is greater than half the width Wm of the mask pattern 20. More preferably, the width of the bottom edge of the mask pattern 20 that is exposed by the undercut region 52 (i.e., the sum of the amount of lateral etching of the metal silicide layer in the first etchant 40 and the amount of lateral etching of the metal silicide layer in the second etchant 50) is between about 50 to 1000 Å, and more preferably about 200 Å.

After the metal silicide layer 16 with the smooth surface 16s is formed, the resulting structure is subjected to a rinsing process with deionized water.

The stripping process, the rinsing process, the etching in the first etchant 40 and the subsequent rinsing process, described above with reference to FIG. 1C, and the etching in the second etchant 50 and the subsequent rinsing process with deionized water, described above with reference to FIG. 1D, can be continuously carried out in different baths provided in a single cleaning system.

Figure 1E:
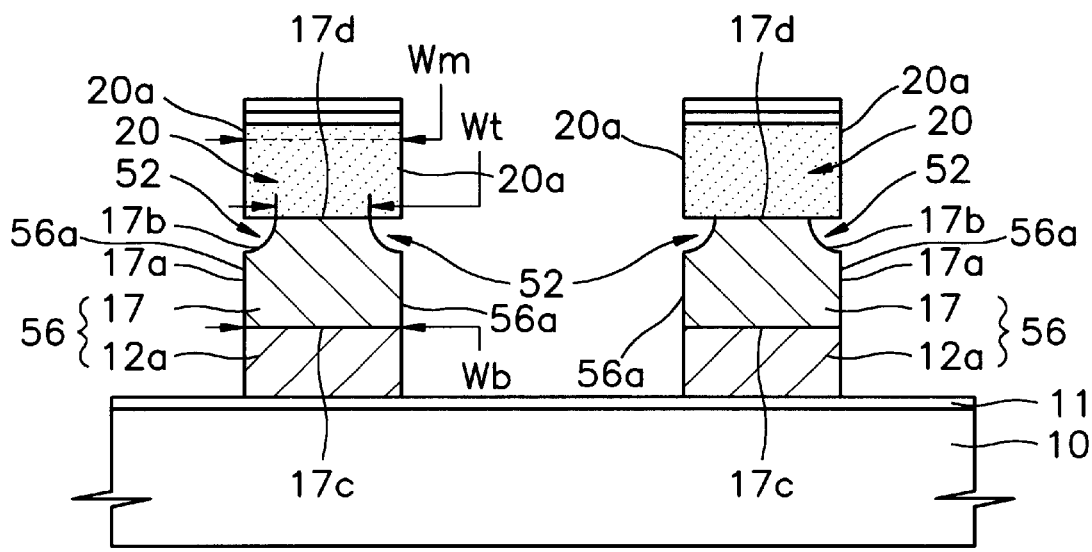

Referring to FIG. 1E, the metal silicide layer 16 with the smooth surface 16s, and the underlying doped polysilicon layer 12 are anisotropically dry etched using the mask pattern 20 as an etching mask, to form a gate structure 56 including a doped polysilicon pattern 12a and the metal silicide pattern 17. The metal silicide pattern 17 has lower edges 17a, which are substantially perpendicular to the major surface of the semiconductor substrate 10, and upper edges 17b which are chamfered along the contour of the undercut regions 52. The width of the top surface 17d of the metal silicide pattern 17 is defined by the recesses formed at the upper chamfered edges 17b. The mask layer (electrically insulating capping layer) 20 has opposing sidewalls 20a that are self-aligned with opposing sidewalls 56a of the gate structure 56.

Still referring to FIG. 1E, the top surface 17d of the metal silicide pattern 17 has a width Wt smaller than the width Wm of the mask pattern 20 and greater than half the width Wm of the mask pattern 20. The bottom surface 17c of the metal silicide pattern 17 has a width Wb substantially equal to the width Wm of the mask pattern 20. The maximum width of the metal silicide pattern 17 is substantially equal to the width of the doped polysilicon pattern 12a.

A plasma etching technique is preferably used to perform the anisotropic dry etching of the metal silicide pattern 17 and the doped polysilicon pattern 12a. The plasma etching technique preferably employs a gas mixture comprising at least one gas selected from the group consisting of $SF_6$, $O_2$, $N_2$, HBr and He-$O_2$, and $Cl_2$ gas. As will be understood by those skilled in the art, a transformer coupled plasma (TCP) source type apparatus and a decoupled plasma source (DPS) type apparatus or the like can be used as an etching apparatus. By appropriately controlling the composition of the gas mixture for the plasma etching, the metal silicide pattern 17 and the doped polysilicon pattern 12 can be simultaneously or separately formed. For the separate etching process, the metal silicide pattern 17 is first formed using a gas mixture with a composition that will be understood by those skilled in the art, and the doped polysilicon pattern 12a is formed using a gas mixture having a composition that is highly selective with respect to the oxide layer 11.

Figure 1F:
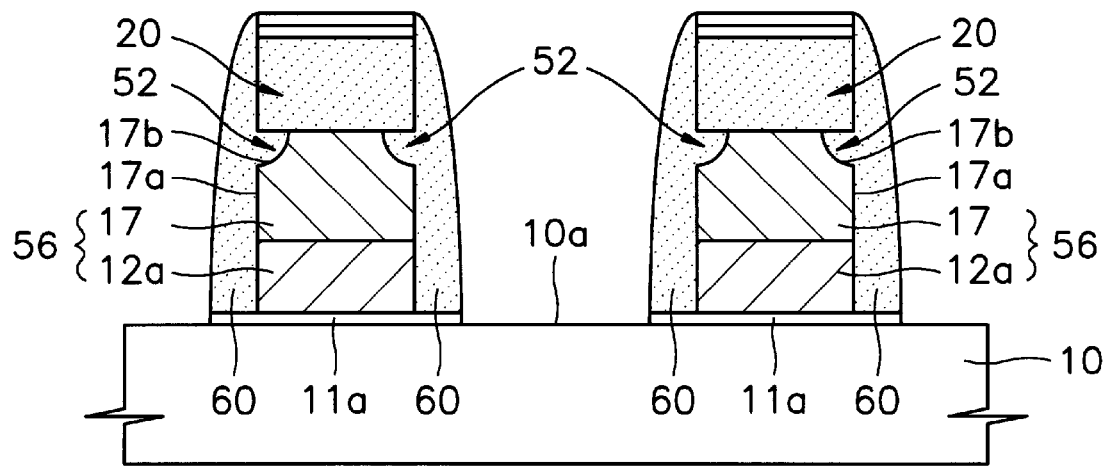

Referring now to FIG. 1F, a silicon nitride layer is deposited over the resultant structure having the electrically insulating capping layer (mask pattern) 20 on the gate structure 56. The structure is then subjected to an etchback process, so that spacers 60 are formed on the sidewalls of the electrically insulating capping layer 20 and the gate structure 56.

During the etchback process for forming the spacers 60, the deposited silicon nitride layer is over etched such that the oxide layer 11 between neighboring spacers is removed, and thus an active region 10a of the semiconductor substrate 10 is exposed. Meanwhile, the oxide layer 11 beneath the gate structure 56 and the spacers 60, i.e., the gate oxide layer 11a, remains.

As illustrated in FIG. 1F, the microelectronic structure includes an electrically conductive line having a first conductive layer comprising a first material and a second conductive layer comprising a metal silicide material different from the first material on the first conductive layer. The second conductive layer has a first sidewall with a first chamfered upper edge and an opposing second sidewall with a second chamfered upper edge. An electrically insulating capping layer extends on the second conductive layer. The electrically insulating capping layer has a first sidewall that is self-aligned with the first sidewall of the second conductive layer so that the first chamfered upper edge is recessed relative to the first sidewall of the electrically insulating capping layer and defines a first undercut region. The electrically insulating capping layer has an opposing second sidewall that is self-aligned with the opposing second sidewall of the second conductive layer so that the second chamfered upper edge is recessed relative to the second opposing sidewall of the electrically insulating capping layer and defines a second undercut region. A first electrically insulating spacer extends on the first sidewall of the second conductive layer and on the first sidewall of the electrically insulating capping layer. The first insulating spacer fills the first undercut region. A second electrically insulating spacer extends on the second sidewall of the second conductive layer and on the second sidewall of the electrically insulating capping layer. The second insulating spacer filling the second undercut region. The second conductive layer has an upper surface with a width defined by the upper ends of the first and the second upper chamfered edges that is greater than half the width of a lower edge of the electrically insulating capping layer. The width of a lower edge of the electrically insulating capping layer exposed by the first and the second undercut regions is preferably between about 50 and 1000 Å.

Figure 1G:
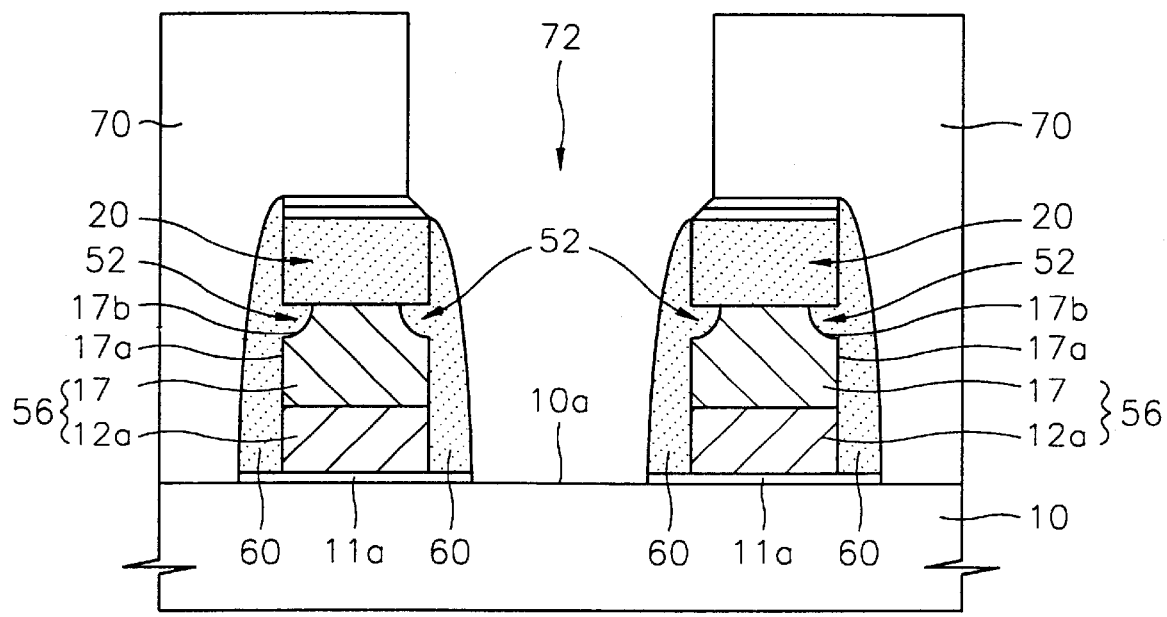

Referring now to FIG. 1G, a planarized interlayer dielectric (ILD) film 70 is deposited over the structure having the spacers 60, and then selectively etched using a photoresist pattern (not shown), to thereby form a self-aligned contact hole 72. The self-aligned contact hole 72 exposes both the spacers 60 and the active region 10a of the semiconductor substrate 10.

Figure 1H:
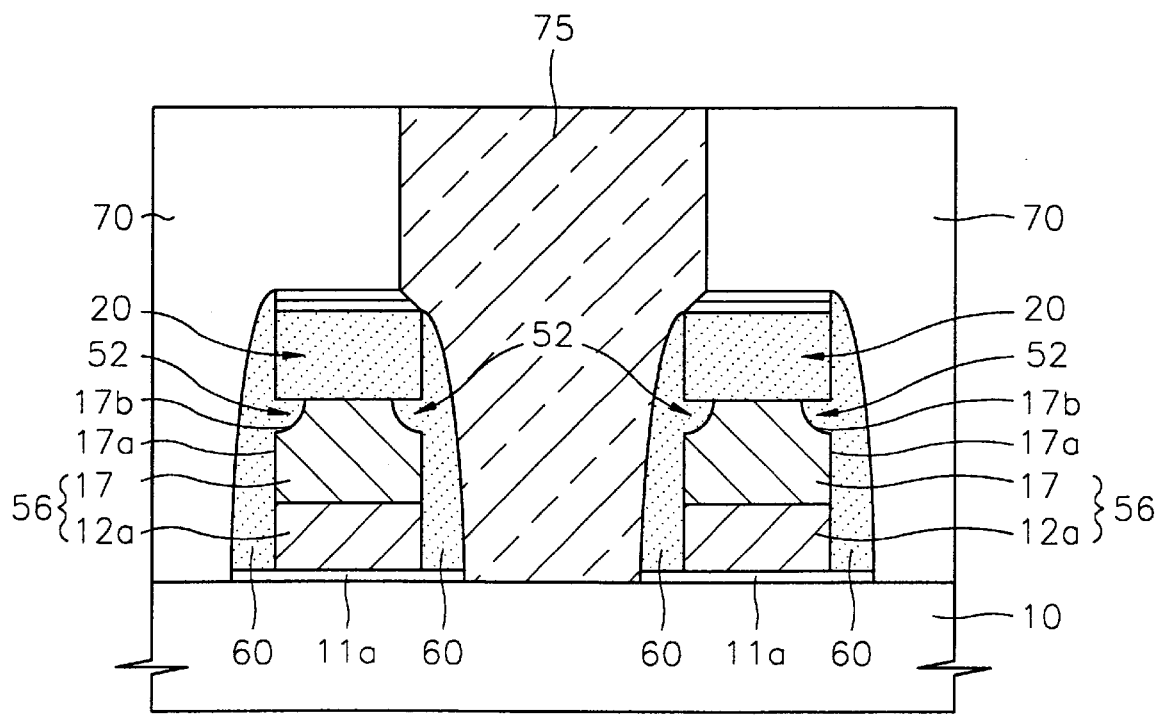
Figure 2A:
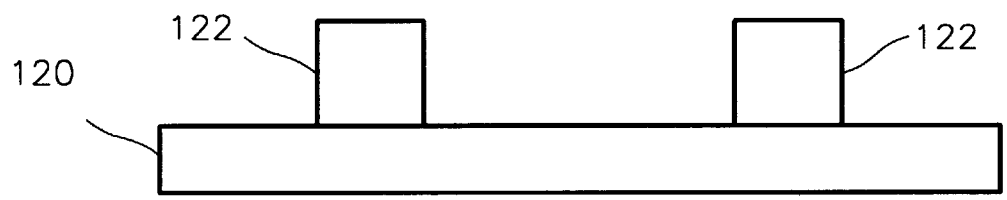
FIGS. 2A through 2G are sectional views illustrating the manufacture of a semiconductor memory device according to the prior art.
Figure 2B:
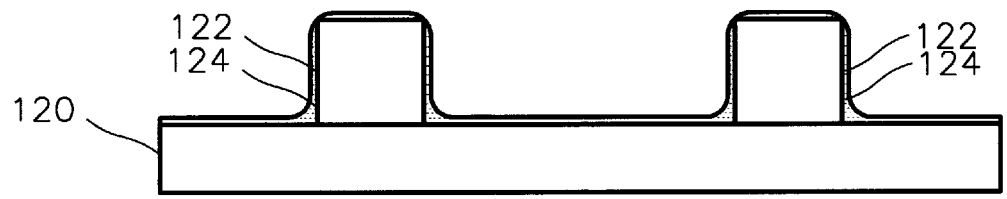
Figure 2C:
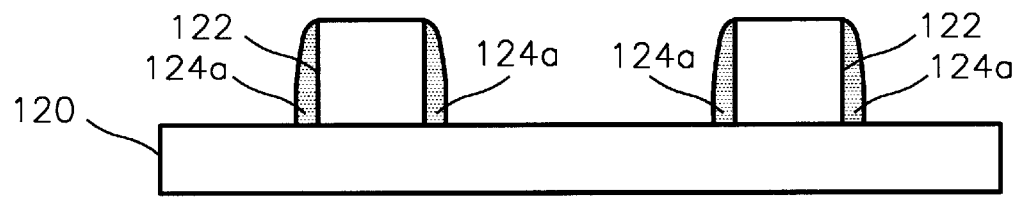
Figure 2D:
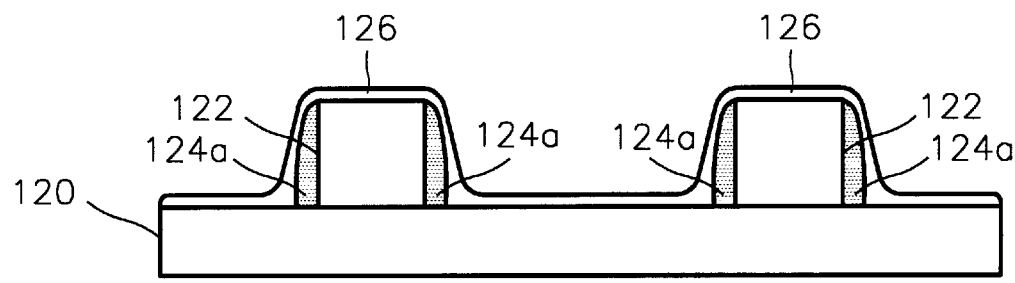
Figure 2E:
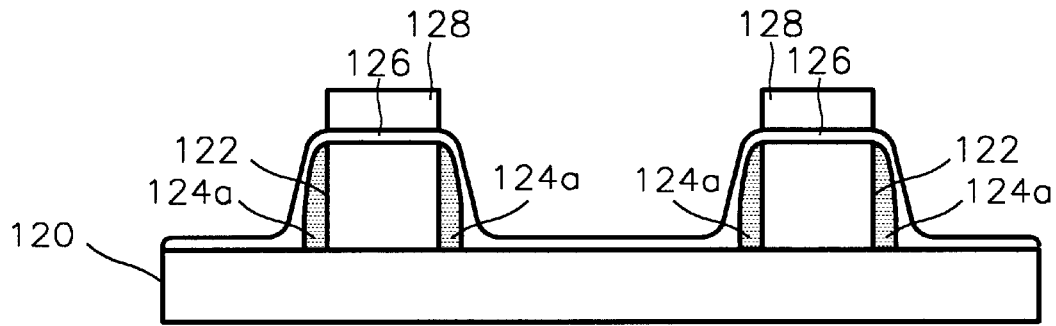
Figure 2F:
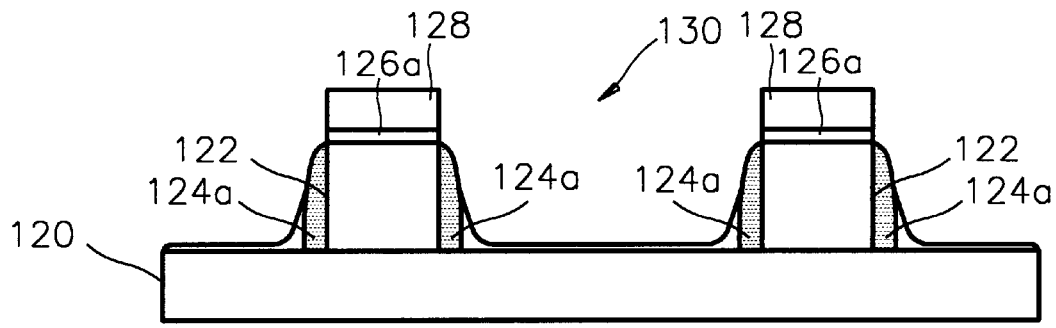
Figure 2G:
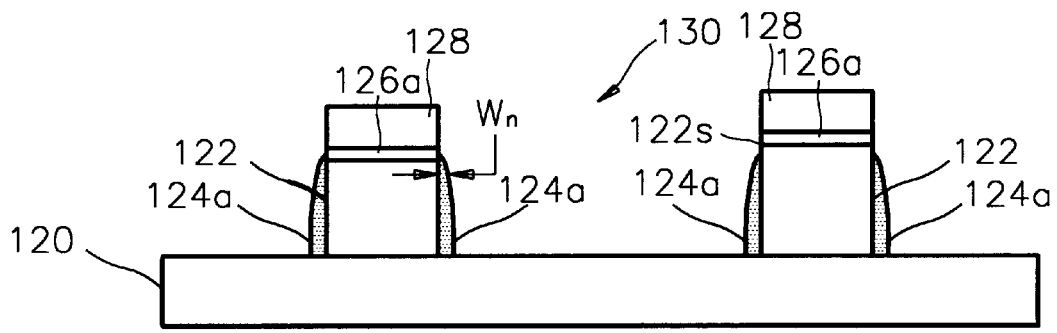

Referring now to FIG. 1H, the self-aligned contact hole 72 is filled with a conductive material, for example, doped polysilicon, to thereby form a contact plug 75 which is self-aligned with the gate structures 56. The metal silicide pattern 17 of the gate structure 56 has chamfered upper edges 17b that are recessed under the bottom edge of the electrically insulating capping layer 20 to define undercut regions 52. The spacer 60 fills the recessed undercut regions 52 to ensure that the spacer 60 is between the gate structure 56 and the contact plug 75. In this manner, the microelectronic structure of the present invention may reduce or eliminate the likelihood of a short between the gate structure 56 and the contact plug 75, which short may result from an insufficiently thick insulating spacer 60.

As illustrated in FIG. 1H, the microelectronic structure includes a contact plug having a conductive material that is self-aligned with the electrically conductive line and with the electrically insulating capping layer. The first electrically insulating spacer is between the electrically conductive line and the contact plug. The first and the second insulating spacers each comprise a nitride material. The first and the second insulating spacers each have an upper width adjacent the second electrically conductive layer that is greater than a lower width adjacent the first electrically conductive layer. The electrically insulating capping layer extends directly on the second conductive layer of the electrically conductive line. The electrically conductive line is preferably a gate structure. Exemplary structures may be described in pending U.S. application Ser. No. 09/536,427, filed on Mar. 27, 2000, which is assigned to the assignee of the present application and is hereby incorporated herein by reference in its entirety.

As described above, methods for manufacturing a semiconductor device according to the present invention result in a gate structure having a chamfered upper sidewall. More specifically, a metal silicide layer in the gate structure has a chamfered upper sidewall. A portion of the metal silicide layer is isotropically etched by a first etchant that possess good etch characteristics with respect to metal to form a metal silicide layer with a shallow groove. Following the first etching process, the metal silicide layer with the shallow groove is further subjected to isotropic etching using a second etchant that possesses better etch characteristics with respect to silicon when compared with etch characteristics of the first etchant.

Although the inventive method has been described with reference to the formation of a contact plug self-aligned with a gate structure, which is a preferred embodiment, it is to be understood that the present invention is not limited to the preferred embodiment. In other words, the semiconductor device manufacturing method according to the present invention can be effectively applied to the formation of chamfered upper edges in various conductive layers including metal silicide layers. For example, the semiconductor device manufacturing method according to the present invention can be applied in forming chamfers on the upper edge of bit lines including a metal silicide layer. For example, in a semiconductor device with a capacitor over bit line (COB) structure, when contact plugs for connecting capacitors to active regions of a semiconductor substrate, or contact plugs connected to intermediate pads formed over bit lines, are formed in a self-aligning manner with the bit line, a sufficient insulation margin between the bit lines and the contact plug can be ensured using methods of the present invention.

In the method for manufacturing a semiconductor device according to the present invention, chamfers are formed on the upper edge of a gate structure, more specifically on the upper edge of a metal silicide layer of the gate structure, using a first and a second etching process. In the first etching process, a portion of the metal silicide layer is isotropically etched using a first etchant which has a relatively good etching property with respect to metal. Then, in a second etching process, the metal silicide layer is isotropically etched using a second etchant which has a relatively good etching property with respect to silicon when compared with that of the first etchant. The second etching process removes fluey defects from the grooved metal silicide layer and sharp edges of the metal silicide layer thereof underneath the mask pattern that result from the silicon which was not removed by the first etching process. As a result, the rough surface of the metal silicide layer due to the fluey defects becomes smooth, and preferably is performed such that sufficient undercut spaces are ensured beneath the bottom edge of the mask pattern. Therefore, the insulation margin between the chamfered metal silicide pattern of the gate structure and the contact plug, which is self-aligned with the gate structure, increases. The inventive methods may be advantageous in manufacturing highly integrated semiconductor devices having a design rule of 0.25 $\mu$m or less.

Also, the formation of the metal silicide pattern with chamfered upper edges according to embodiments of the present invention can be carried out at the time of stripping the photoresist pattern used in patterning the metal silicide layer, which is an essential process in the semiconductor device manufacture, without need for additional processes. In other words, in the semiconductor device manufacturing methods according to embodiments of the present invention, after the photoresist pattern is removed by an ashing process, the resultant structure may be continuously subjected to a common stripping process and 2-stage isotropic wet etching process in a single cleaning system. The undercut regions can be formed by efficiently utilizing the processes in the manufacture of semiconductor devices without the need for additional process steps.

While this invention has been particularly shown and described with reference to preferred embodiments thereof, it will be understood by those skilled in the art that various changes in form and details may be made therein without departing from the spirit and scope of the invention as defined by the appended claims.

That which is claimed is:

1. A method for manufacturing a semiconductor device, comprising:

forming a mask pattern on a metal silicide layer to expose a portion of the metal silicide layer;

isotropically etching the exposed portion of the metal silicide layer in a first etchant to form a metal silicide layer with a shallow groove and defects due to silicon remaining on the surface of the metal silicide layer; and isotropically etching the exposed portion of the metal silicide layer with a shallow groove in a second etchant to remove the defects due to the silicon remaining on the surface of the metal silicide layer and to form a metal silicide layer with a smooth surface.

2. The method according to claim 1, wherein the first etchant consists essentially of $NH_4OH$, $H_2O_2$ and $H_2O$.

3. The method according to claim 1, wherein the second etchant consists essentially of $HNO_3$, $CH_3COOH$, HF and $H_2O$.

4. The method according to claim 1, wherein the metal silicide layer is formed of tungsten silicide ($WSi_x$), titanium silicide ($TiSi_x$), tantalum silicide ($TaSi_x$), cobalt silicide ($CoSi_x$), or combinations thereof.

5. A method for manufacturing a semiconductor device, comprising:

forming a metal silicide layer on a semiconductor substrate;

forming a mask pattern on the metal silicide layer to expose a portion of the metal silicide layer;

isotropically etching the exposed portion of the metal silicide layer in a first etchant using the mask pattern as an etching mask to form a metal silicide layer with shallow groove;

isotropically etching the metal silicide layer with the shallow groove in a second etchant using the mask pattern as an etching mask, to form a metal silicide layer with a recessed region having a smooth surface, the recessed region defining a undercut region beneath the bottom edge of the mask pattern; and anisotropically etching the exposed metal silicide layer using the mask pattern as an etching mask, to form a metal silicide pattern having lower edges substantially perpendicular to the major surface of the semiconductor substrate, and upper edges which are chamfered along the contour of the undercut region.

6. The method according to claim 5, wherein the first etchant consists essentially of $NH_4OH$, $H_2O_2$ and $H_2O$.

7. The method according to claim 5, wherein the first etchant is maintained at a temperature between about 30 and 90° C.

8. The method according to claim 5, wherein the first etchant comprises between about 0.5 and 3% $NH_4OH$ and between about 2 and 20% $H_2O_2$.

9. The method according to claim 5, wherein the second etchant has a relatively good etching property with respect to silicon compared to the first etchant.

10. The method according to claim 5, wherein the second etchant consists essentially of $HNO_3$, $CH_3COOH$, HF and $H_2O$.

11. The method according to claim 5, wherein the second etchant is maintained at room temperature.

12. The method according to claim 5, wherein the second etchant comprises between about 3 and 38% $HNO_3$, between about 0.5 and 3.5% $CH_3COOH$ and between about 0.05 and 0.65% HF.

13. The method according to claim 5, wherein the width of the top surface of the metal silicide pattern is defined by chamfers at both sides thereof, and is greater than half the width of the lower surface of the mask pattern.

14. The method according to claim 5, further comprising the steps of:

forming insulation spacers on the sidewalls of the mask pattern and metal silicide pattern;

forming interlayer dielectric patterns with a self-aligned contact hole therebetween, the self-aligned contact hole exposing both the insulation spacers and an active region of the semiconductor substrate; and filling the self-aligned contact hole with a conductive material to form a contact plug self-aligned with the metal silicide pattern.

15. The method according to claim 14, wherein the insulation spacers comprise a nitride material.

16. The method according to claim 5, further comprising:

forming an insulating layer on the metal silicide layer;

forming a photoresist pattern on the insulating layer;

etching the insulation layer using the photoresist pattern as an etching mask to form the mask pattern;

ashing the photoresist pattern; and stripping off the residue in a wet cleaning system after the ashing step, wherein the etching in the first etchant and the etching in the second etchant are continuously carried out in the wet cleaning system immediately after stripping off the residue.

17. The method according to claim 16, wherein the insulating layer comprises a nitride material.

* * * * *